(12) United States Patent
Okada et al.

(10) Patent No.: US 9,617,655 B2
(45) Date of Patent: Apr. 11, 2017

(54) MANUFACTURING APPARATUS OF SIC SINGLE CRYSTAL AND METHOD FOR MANUFACTURING SIC SINGLE CRYSTAL

(75) Inventors: Nobuhiro Okada, Tokyo (JP); Kazuhito Kamei, Tokyo (JP); Kazuhiko Kusunoki, Tokyo (JP); Nobuyoshi Yashiro, Tokyo (JP); Kouji Moriguchi, Tokyo (JP); Hironori Daikoku, Susono (JP); Hiroshi Suzuki, Gotenba (JP); Tomokazu Ishii, Susono (JP); Hidemitsu Sakamoto, Susono (JP); Motohisa Kado, Susono (JP); Yoichiro Kawai, Okazaki (JP)

(73) Assignees: NIPPON STEEL & SUMITOMO METAL CORPORATION, Tokyo (JP); TOYOTA JIDOSHA KABUSHIKI KAISHA, Aichi-ken (JP)

( * ) Notice: Subject to any disclaimer, the term of this patent is extended or adjusted under 35 U.S.C. 154(b) by 713 days.

(21) Appl. No.: 13/997,722

(22) PCT Filed: Dec. 26, 2011

(86) PCT No.: PCT/JP2011/080098
§ 371 (c)(1),
(2), (4) Date: Jun. 25, 2013

(87) PCT Pub. No.: WO2012/090946
PCT Pub. Date: Jul. 5, 2012

(65) Prior Publication Data
US 2013/0284083 A1  Oct. 31, 2013

(30) Foreign Application Priority Data
Dec. 27, 2010  (JP) ................. 2010-289345

(51) Int. Cl.
*C30B 15/20*  (2006.01)
*C30B 29/36*  (2006.01)
(Continued)

(52) U.S. Cl.
CPC .............. *C30B 15/20* (2013.01); *C30B 15/14* (2013.01); *C30B 15/30* (2013.01); *C30B 17/00* (2013.01);
(Continued)

(58) Field of Classification Search
CPC ......... C30B 15/14; C30B 15/20; C30B 15/30; C30B 17/00; C30B 29/36; Y10T 117/1068
See application file for complete search history.

(56) References Cited

U.S. PATENT DOCUMENTS

2007/0280328 A1* 12/2007 Lee .................. H05B 6/24
373/155
2010/0031870 A1* 2/2010 Sreedharamurthy ... C30B 29/06
117/15

FOREIGN PATENT DOCUMENTS

JP  2005-179080  7/2005
JP  2005179080 A * 7/2005
(Continued)

OTHER PUBLICATIONS

Solution growth of SiC from silicon melts: Influence of the alternative magnetic field on fluid dynamics, Mercier et al., Journal of Crystal Growth 318 (2011) 385-388.*
(Continued)

*Primary Examiner* — Michael Kornakov
*Assistant Examiner* — Hua Qi
(74) *Attorney, Agent, or Firm* — Clark & Brody

(57) ABSTRACT

An apparatus for SIC single crystal has an induction heating control unit such that frequency f (Hz) of alternating current to the induction heating unit satisfies Formula (1); D1 (mm) is permeation depth of electromagnetic waves into a crucible side wall by the heating unit, D2 (mm) is permeation depth of electromagnetic waves into a SIC solution, T (mm) is
(Continued)

thickness of the crucible side wall of the crucible, and R (mm) is crucible inner radius:

$$(D1-T) \times D2/R > 1.5 \quad (1)$$

where, D1 is defined by Formula (2) and D2 by Formula (3):

$$D1 = 503292 \times (1/(f \times \sigma c \times \mu c))^{1/2} \quad (2)$$

$$D2 = 503292 \times (1/(f \times \sigma s \times \mu s))^{1/2} \quad (3);$$

$\sigma c$ is electric conductivity (S/m) of the sidewall, $\sigma s$ is electric conductivity (S/m) of the SiC solution; $\mu c$ is relative permeability of the sidewall, and $\mu s$ is relative permeability of the SIC solution.

4 Claims, 5 Drawing Sheets

(51) Int. Cl.
*C30B 15/14* (2006.01)
*C30B 17/00* (2006.01)
*C30B 15/30* (2006.01)

(52) U.S. Cl.
CPC ............ *C30B 29/36* (2013.01); *C30B 15/305* (2013.01); *Y10T 117/1068* (2015.01)

(56) References Cited

FOREIGN PATENT DOCUMENTS

| JP | 2006-117441 | 5/2006 |
| JP | 2007-254233 | 10/2007 |
| JP | 2008-100890 | 5/2008 |
| JP | 2010-208926 | 9/2010 |

OTHER PUBLICATIONS

Coupled heat transfer and fluid dynamics modeling of high-temperature SiC solution growth, Mercier et al., Journal of Crystal Growth 312 (2010) 155-163.*

Mercier et al., "Solution growth . . . fluid dynamics", Journal of Crystal Growth, Oct. 23, 2010, pp. 385-388.

* cited by examiner

MANUFACTURING APPARATUS OF SIC SINGLE CRYSTAL AND METHOD FOR MANUFACTURING SIC SINGLE CRYSTAL

TECHNICAL FIELD

The present invention relates to a manufacturing apparatus of a silicon carbide (SiC) single crystal and a method for manufacturing a SiC single crystal, and more particularly to a manufacturing apparatus of a SiC single crystal by a solution growth method and a method for manufacturing a SiC single crystal.

BACKGROUND ART

Silicon carbide (SiC) is a thermally and chemically stable compound semiconductor. Compared with silicon (Si), SiC has an excellent band gap, break down voltage, electron saturation velocity, and thermal conductivity. Therefore, SiC is promising for application in technical fields such as power device materials with low operating loss, high-voltage resistant high-frequency device materials, environment-resistant devices used in high-temperature environments, and radiation-resistant devices. In these technical fields, a high quality SiC single crystal with few crystal defects is demanded.

Methods for manufacturing a SiC single crystal include a sublimation method and a solution growth method. Compared to the sublimation method, the solution growth method can produce a Sic single crystal with less crystal defects. The solution growth method of a SiC single crystal is a method of growing a SiC single crystal by bringing a SiC seed crystal into contact with a solution in which carbon (C) is dissolved into a melt containing Si or Si and additive elements (hereafter referred to as a SiC solution). In general, a crucible made of graphite is used, and carbon dissolves from the crucible to be fed into the SiC solution. The SiC seed crystal is attached to a lower end surface of a bar-shaped seed shaft and is brought into contact with the SiC solution.

In the solution growth method, the temperature of the portion of the SiC solution in the periphery of the SiC seed crystal (hereafter, referred to as a SiC seed-crystal peripheral area) is kept lower than that of the other portion of SiC solution. This will cause a supersaturation of SiC in the SiC seed-crystal peripheral area, thereby accelerating the growth of the SiC single crystal.

As described above, the solution growth method allows manufacture of a SiC single crystal which has less crystal defects than in the sublimation method. However, the growth rate of the SiC single crystal in the solution growth method is lower than in the sublimation method. For example, in a conventional solution growth method, the growth rate of SiC single crystal in solution growth method is about 5 to 12 μm/hr when a pure Si solution of 1650° C. is used. This growth rate is not more than 1/10 of that of SiC single crystal in the sublimation method.

The growth rate RA (m/s) of SiC single crystal in the solution growth method is defined by the Wilson-Frenkel formula shown in Formula (A):

$$RA = A0 \times \Delta C \times \exp(-\Delta G/(k \times t)) \tag{A}$$

where, A0 is a coefficient, $\Delta C$ is the degree of supersaturation of carbon (unit: mol/m$^3$), $\Delta G$ is the energy (unit: J/mol) needed for taking away a solvent molecule from a solute molecule, k is the gas constant (unit: J/K·mol), and t is absolute temperature (K).

It can be seen from Formula (A) that increasing the degree of supersaturation ($\Delta C$) of carbon in the SiC solution allows an increase in the growth rate RA of SiC single crystal. Increasing the feed rate of carbon to a portion near the SiC seed crystal, of the SiC solution will allow an increase in the degree of supersaturation of carbon ($\Delta C$).

JP2006-117441A (Patent Document 1) discloses a technique to increase the feed rate of carbon to the vicinity of a SiC seed crystal. Patent Document 1 applies an accelerated crucible rotation technique (hereafter, referred to as ACRT method) to the solution growth method of SiC single crystal. In the ACRT method, acceleration and deceleration are repeated for the rotation of the SiC seed crystal and the rotation of the crucible. This will cause the SiC solution to be stirred, thereby facilitating feeding of carbon to the vicinity of the SiC seed crystal.

DISCLOSURE OF THE INVENTION

However, even in a method other than the ACRT method, it is preferable that carbon is more likely to be fed to a portion near the SiC seed crystal.

It is an object of the present invention to provide a manufacturing apparatus of a SiC single crystal, in which carbon is more likely to be fed to a portion near a SiC seed crystal in a SiC solution in the manufacturing of a SiC single crystal by a solution growth method.

A manufacturing apparatus of a SiC single crystal according to an embodiment of the present invention includes a crucible, a chamber, a vertical seed shaft, an induction heating unit, and a control unit. The crucible includes a tubular side wall and a bottom wall disposed at a lower end of the side wall. The crucible can house a SiC solution. The chamber houses the crucible. The seed shaft extends in an up-and-down direction of the chamber. The seed shaft, which has a lower end surface to which a SiC seed crystal is to be attached, is able to bring the SiC seed crystal attached to the lower end surface thereof into contact with the SiC solution. The induction heating unit is disposed around the side wall of the crucible in the chamber. The control unit controls the induction heating unit. The control unit controls the induction heating unit such that a frequency f (Hz) of alternating current to be passed to the induction heating unit satisfies Formula (1), where D1 (mm) indicates a permeation depth of electromagnetic waves into the side wall by the induction heating unit, D2 (mm) indicates a permeation depth of electromagnetic waves into the SiC solution by the induction heating unit, T (mm) indicates a thickness of the side wall, and R (mm) indicates an inner radius of the crucible:

$$(D1 - T) \times D2/R > 1 \tag{1}$$

where, D1 is defined by Formula (2), and D2 is defined by Formula (3):

$$D1 = 503292 \times (1/(f \times \sigma c \times \mu c))^{1/2} \tag{2}$$

$$D2 = 503292 \times (1/(f \times \sigma s \times \mu s))^{1/2} \tag{3}$$

where, $\sigma c$ is an electric conductivity of the side wall, $\sigma s$ is an electric conductivity of the SiC solution, $\mu c$ is a relative permeability of the side wall, and $\mu s$ is a relative permeability of the SiC solution.

In the manufacturing apparatus of a SiC single crystal according to an embodiment of the present invention, a SiC solution is heated by induction heating. Further, the SiC solution is stirred by a Lorentz force which is generated by induction heating, facilitating feeding of carbon to the vicinity of a SiC seed crystal.

The method for manufacturing a SiC single crystal according to the present embodiment utilizes the above described manufacturing apparatus.

BEST MODE FOR CARRYING OUT THE INVENTION

Figure 1:
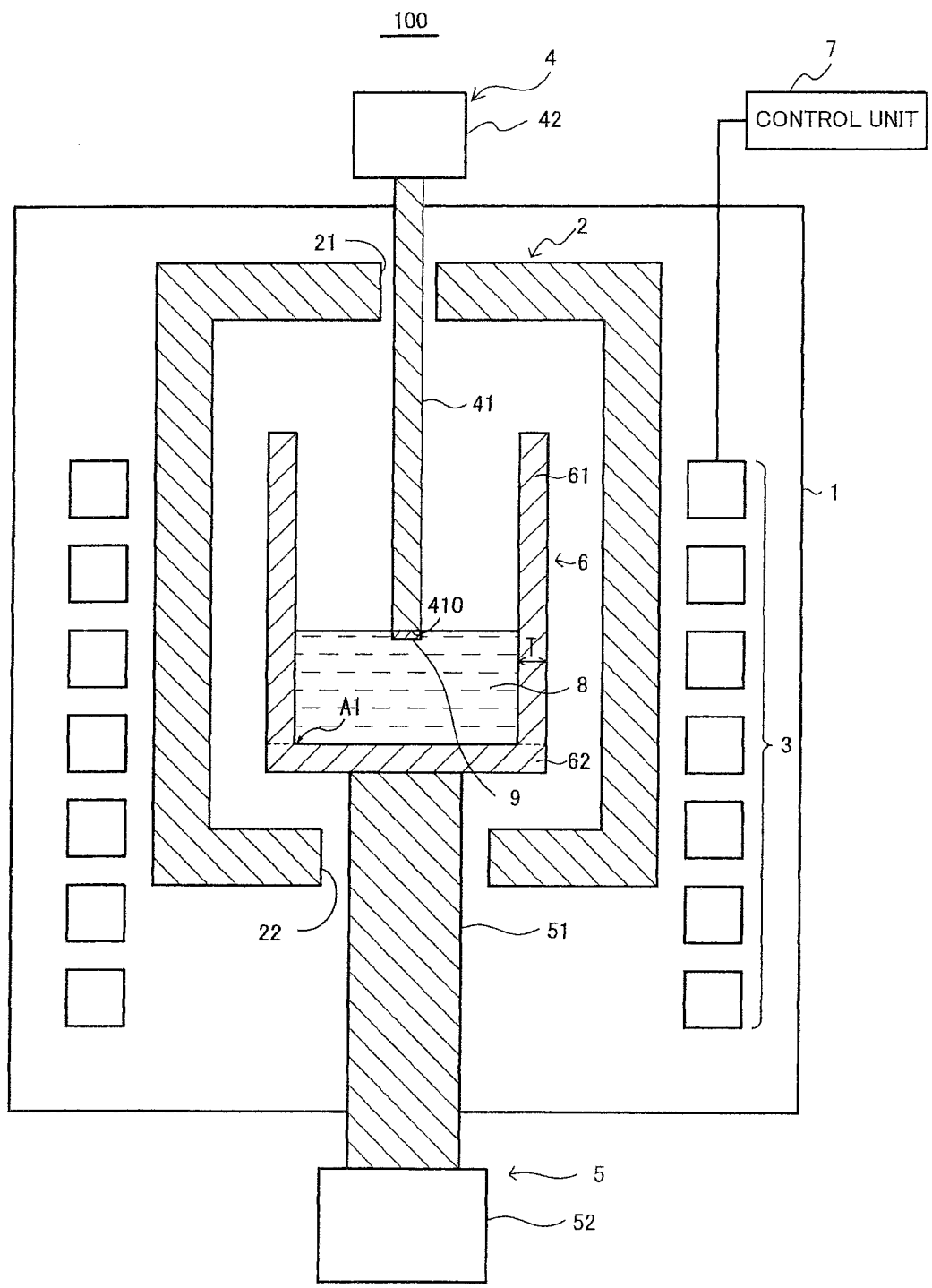
FIG. 1 is a schematic diagram of a manufacturing apparatus of a SiC single crystal according to an embodiment of the present invention.

Hereafter, embodiments of the present invention will be described in detail with reference to the drawings. The same or corresponding components in the drawings will be given the same reference characters and description thereof will not be repeated.

[Configuration of Manufacturing Apparatus of SiC Single Crystal]

FIG. 1 is a configuration diagram of a manufacturing apparatus of a SiC single crystal according to the present embodiment. Referring to FIG. 1, a manufacturing apparatus 100 includes a chamber 1, an insulating member 2, an induction heating unit 3, an up-and-down moving unit 4, a rotation unit 5, a crucible 6, and a control unit 7.

The chamber 1 is a housing and houses the insulating member 2, the induction heating unit 3, and a crucible 6. When a SiC single crystal is manufactured, the chamber 1 is water cooled.

The rotation unit 5 includes a rotating member 51 and a driving source 52. The rotating member 51 has a bar-like shape and extends in the up-and-down direction of the manufacturing apparatus 100. The crucible 6 is disposed at the upper end of the rotating member 51. The crucible 6 may be fixed to the upper end of the rotating member 51. The lower end portion of the rotating member 51 is connected with the driving source 52. When a SiC single crystal is manufactured, the rotation unit 5 rotates the crucible 6. To be specific, the driving source 52 rotates the rotating member 51. On that account, the crucible 6 rotates around the axial centerline of the rotating member 51.

The crucible 6 is a housing which has an open upper end. The crucible 6 includes a tubular side wall 61 and a bottom wall 62. In the present example, the side wall 61 is a cylinder. However, the side wall 61 will not be limited to a cylinder. The side wall 61 only needs to have a tube-shape.

The bottom wall 62 is disposed at the lower end of the side wall 61 and is coupled to the side wall 61. The bottom wall 62 may be integrally formed with the side wall 61, or may be coupled to the side wall 61 after they are formed separately. In FIG. 1, a corner A1 formed between the side wall 61 and the bottom wall 62 has a right angle. However, the corner A1 may be rounded. To be specific, the corner A1 may be provided with a corner radius.

The crucible 6 houses a SiC solution 8. The SiC solution 8, which is the starting material of SiC single crystal, contains silicon (Si) and carbon (C). The SiC solution 8 may further contain one or more kinds of metal elements other than Si and C.

The SiC solution 8 is produced by heating and melting the starting material of a SiC solution. The starting material may be a Si simple substance, or may contain Si and other metal elements. Examples of the metal element contained in the starting material of SiC solution include titan (Ti), manganese (Mn), chromium (Cr), cobalt (Co), vanadium (V), iron (Fe), and so on. Preferable elements to be contained in the starting material of the SiC solution are Ti and Mn, and a more preferable element is Ti.

The raw material of the crucible 6 is, for example, graphite. When the crucible 6 is made up of graphite, the crucible 6 itself serves as a carbon source for the SiC solution. The raw material of the crucible 6 may be other than graphite. For example, the crucible 6 may be made up of ceramics or a high-melting-point metal. When the crucible 6 cannot be used as a carbon source, the starting material of SiC solution will contain graphite (carbon).

Preferably, at least the inner surface of the side wall 61 of the crucible 6 contains carbon. For example, a film made of SiC is formed on the inner surface of the side wall 61. In this case, carbon dissolves into the SiC solution from the film while a SiC single crystal is manufactured. More preferably, the inner surface of the crucible 6 contains carbon. In short, the inner surfaces of the side wall 61 and the bottom wall 62 contain carbon. In this case, the crucible 6 serves as a carbon source of the SiC solution.

The up-and-down moving unit 4 includes a seed shaft 41 and a driving source 42. The driving source 42 is disposed above the chamber 1. The seed shaft 41 is in a bar shape, and extends in the up-and-down direction of the chamber 1. The lower end of the seed shaft 41 is disposed in the chamber 1, and the upper end thereof is disposed above the chamber 1. That is, the seed shaft 41 penetrates through the chamber 1. The seed shaft 41 is disposed in coaxial with the rotating member 51.

The upper end portion of the seed shaft 41 is connected to the driving source 42. The driving source 42 drives the seed shaft 41 to move up and down. The driving source 42 further drives the seed shaft 41 to rotate around the central axis of the seed shaft 41.

The lower end of the seed shaft 41 is disposed in the crucible 6. The seed shaft 41 has a lower end surface 410. A SiC seed crystal 9 is attached to the lower end surface 410.

A SiC seed crystal 9 is in a plate shape and made up of a SiC single crystal. When a SiC single crystal is manufactured by a solution growth method, the SiC single crystal is produced and grown on the surface of the SiC seed crystal 9. When a SiC single crystal having a crystal structure of 4H polymorphism is manufactured, the SiC seed crystal 9 is preferably a single crystal having a crystal structure of 4H polymorphism. More preferably, the surface of the SiC seed crystal 9 (corresponding to the lower surface of the SiC seed crystal 9 in FIG. 1) is a (0001) plane or a plane inclined by an angle of not more than 8° from the (0001) plane. In this case, the SiC single crystal is likely to grow in a stable manner.

When a SiC single crystal is manufactured, the seed shaft 41 is moved downward and, as shown in FIG. 1, the SiC seed crystal 9 is brought into contact with the SiC solution 8. At this moment, the SiC solution 8 is kept at a crystal growth temperature. The crystal growth temperature depends on the composition of the SiC solution 8. A typical crystal growth temperature is 1600 to 2000° C.

The insulating member 2 is housing-shaped and has a side wall, an upper cover, and a lower cover. The side wall of the insulating member 2 is disposed around the side wall 61 of the crucible 6. The upper cover of the insulating member 2 is disposed above the crucible 6. The upper cover has a through hole 21 for passing the seed shaft 41 therethrough. The lower cover of the insulating member 2 is disposed below the crucible 6. The lower cover has a through hole 22 for passing the rotating member 51 therethrough. In short, the insulating member 2 covers the entire crucible 6.

The insulating member 2 includes a well-known insulating material. The insulating material is a fibrous or non-fibrous molded insulating material. In order to form a SiC single crystal having a diameter of not less than 2 inches, a high heating efficiency needs to be maintained. The insulating member 2 can maintain a high heating efficiency.

The induction heating unit 3 is disposed around the crucible 6. To be more specific, it is disposed in the outer circumference of the insulating member 2. In the present example, the induction heating unit 3 is a ring-shaped high-frequency coil and is disposed in coaxial with the seed shaft 41 and the rotating member 51. The induction heating unit 3 inductively heats the crucible 6 and thereby melts the starting material housed in the crucible 6, thus producing a SiC solution 8. The induction heating unit 3 further provides a Lorentz force to the SiC solution 8, thereby stirring the SiC solution 8.

The control unit 7 controls the entire manufacturing apparatus 100. Therefore, the control unit 7 also controls the induction heating unit 3. The control unit 7 includes, although not shown, a central processing unit (CPU) and memories (ROM and RAM). The ROM stores a control program of the induction heating unit 3. The control unit 7 controls the induction heating unit 3 by the control program being loaded on the RAM from the ROM and executed by the CPU.

[Overview of Control of Induction Heating Unit 3 by Control Unit 7]

The control unit 7 adjusts the frequency f of the alternating current to be passed to the induction heating unit 3. By doing this, the control unit 7 heats the SiC solution 8 to a crystal growth temperature, and stirs the SiC solution, facilitating feeding of carbon to the vicinity of the SiC seed crystal 9. Hereafter, this point will be described.

As described above, to increase the growth rate of a SiC single crystal in the solution growth method, it may be arranged such that the degree of supersaturation ($\Delta C$) of carbon is increased in a portion near the SiC seed crystal 9, of the SiC solution 8. And to increase the degree of supersaturation of carbon in the vicinity of the SiC seed crystal 9, it may be arranged such that carbon in the SiC solution can be easily conveyed to the vicinity of the SiC seed crystal 9 while a SiC single crystal is manufactured.

When alternating current is passed to the induction heating unit 3, a Lorentz force is produced in the SiC solution 8. To be specific, as the alternating current that flows in the coil of the induction heating unit 3 varies with time, the magnetic field will also vary with time. The orientation of the magnetic field reverses each time the direction of current that flows in the induction heating unit 3 changes. So as to cancel such variation of magnetic field, an eddy current, which flows in the opposite direction to that of the current that flows in the coil, occurs in the SiC solution 8. This phenomenon is electromagnetic induction, and Joule heat is generated by the eddy current, which is generated by electromagnetic induction, in the SiC solution 8 and the crucible 9. Further, a Lorentz force (electromagnetic force) acting from the vicinity of the outer circumference of the SiC solution 8 toward the center of the SiC solution 8 is generated in the SiC solution 8 by the interaction between the eddy current and the magnetic field.

Figure 2:
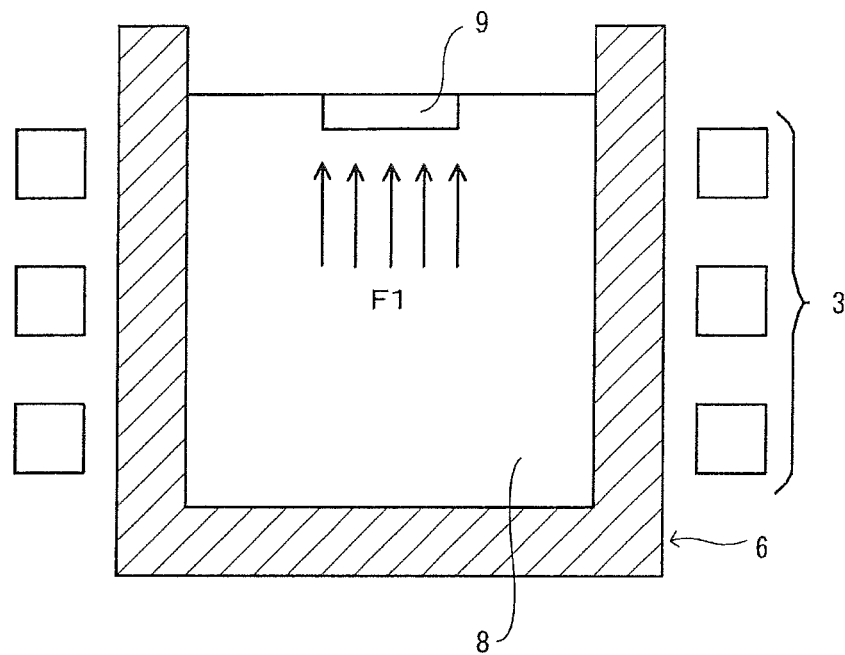
FIG. 2 is a schematic diagram for illustrating an upward flow which occurs in a SiC solution in the crucible in FIG. 1.

The induction heating unit 3 causes a Lorentz force to act in the SiC solution 8. Then, the SiC solution 8 is stirred in the crucible 6 by the Lorentz force. It is preferable that as the result of the SiC solution 8 being stirred, an upward flow F1 is formed below the SiC seed crystal 9 in the SiC solution 8 as shown in FIG. 2. This is because, owing to the upward flow F1, carbon in the SiC solution 8 becomes more likely to be conveyed to the vicinity of the SiC seed crystal 9 so that the degree of supersaturation of carbon ($\Delta C$) in a portion near the SiC seed crystal 9 of the SiC solution 8 increases. Further, when the inner surface of the side wall 61 of the crucible 6 contains carbon, carbon that has dissolved into the SiC solution 8 from the side wall 61 is conveyed to the vicinity of the SiC seed crystal 9 by the upward flow F1.

Further, a larger flow velocity of the upward flow F1 is preferable. That is because, as the flow velocity increases, the feed rate of carbon to the vicinity of the SiC seed crystal 9 increases. Therefore, it is preferable that an upward flow F1 having a large flow velocity is produced by a Lorentz force.

When the frequency f of a two-phase or three-phase alternating current is a low frequency (less than 100 Hz) in induction heating, it is possible to control the direction of a Lorentz force. However, since the heat quantity of induction heating is small at a frequency as low as about 100 Hz, it is difficult to heat the SiC solution 8 to 1600 to 2000° C. Therefore, for the induction heating unit 3 to heat the SiC solution up to 1600 to 2000° C., the frequency f is preferably a high frequency of not less than 1 kHz.

When the frequency f is a high frequency (not less than 1 kHz), although it is not possible to control the direction of the Lorentz force, it is possible to control the magnitude of the Lorentz force. In the manufacturing apparatus 100 in the present embodiment, the induction heating unit 3 can heat the SiC solution 8, and produces an upward flow F1 having a large flow velocity, the control unit 7 controls the induction heating unit 3 such that the frequency f (Hz) of the alternating current to be passed to the induction heating unit 3 satisfies Formula (1):

$$(D1-T) \times D2/R > 1 \quad (1)$$

where, T is the thickness (mm) of the side wall 61, and R is the inner radius (mm) of the crucible 6; D1 is defined by Formula (2), and D2 is defined by Formula (3):

$$D1 = 503292 \times (1/(f \times \sigma c \times \mu c))^{1/2} \quad (2)$$

$$D2 = 503292 \times (1/(f \times \sigma s \times \mu s))^{1/2} \quad (3)$$

where, σc is the electric conductivity (S/m) of the sidewall 61, and σs is the electric conductivity (S/m) of the SiC solution 8. Also μc is the relative permeability of the sidewall 61 and μs is the relative permeability of the SiC solution 8, where μc and μs are dimensionless quantities.

The thickness T is determined, for example, by the following method. As shown in FIG. 1, the thickness T is an average value of thickness of a portion of the side wall 61 in contact with the SiC solution 8. However, when a corner A1 which is made up of the inner surface of the side wall 61 and the inner surface of the bottom wall 62 forms a corner radius, the thickness of the corner A1 will not be included into the average value.

Hereafter, Formula (1) will be described. The Lorentz force is proportional to electromagnetic waves generated from the induction heating unit 3. The electromagnetic waves generated at the induction heating unit 3 attenuate as they pass through a conductor. The electromagnetic waves in a conductor attenuate at an exponential rate. Here, the "permeation depth" of electromagnetic waves is defined as the depth at which the electromagnetic wave intensity is exp(−1) (about ⅓) times of the value at the surface of the conductor.

The side wall 61 of the crucible 6 and the SiC solution 8 are both conductors. Therefore, the electromagnetic waves generated at the induction heating unit 3 attenuate in the side wall 61 and the SiC solution 8. The Lorentz force is proportional to electromagnetic waves. Therefore, the Lorentz force is proportional to the permeation depth of electromagnetic waves.

The permeation depth in the side wall 61 of the crucible 6 is defined by D1 (Formula (2)). Further, the permeation depth in the SiC solution 8 is defined by D2 (Formula (3)).

Figure 3:
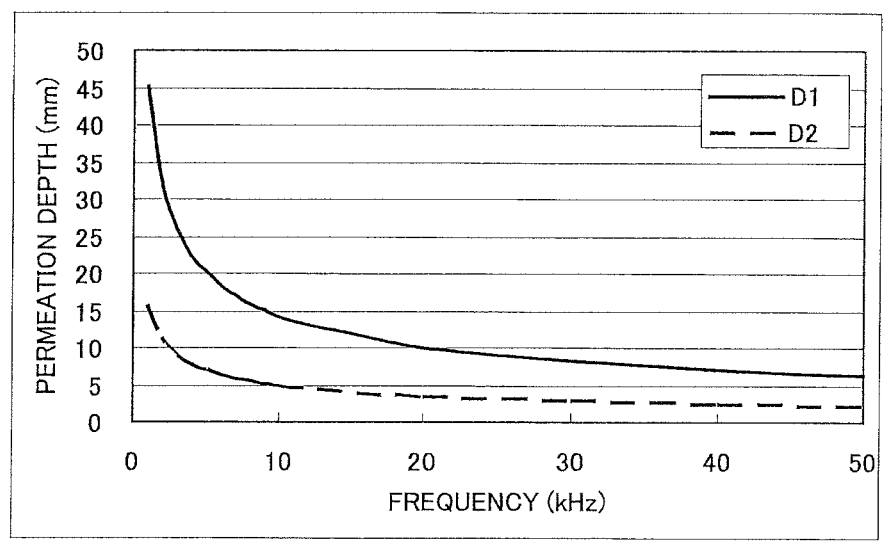
FIG. 3 is a diagram showing the relationship between: permeation depth into the side wall of the crucible and permeation depth into the SiC solution of electromagnetic waves which is generated by an induction heating unit in FIG. 1; and frequency f of alternating current flowing into the induction heating unit.

FIG. 3 is a diagram showing the relationship between the permeation depths D1 and D2 and the frequency f. The solid line in FIG. 3 indicates the permeation depth D1 with respect to the frequency f. The broken line in FIG. 3 indicates the permeation depth D2 with respect to the frequency f. In FIG. 3, calculation has been made supposing that the crucible 6 is a graphite crucible, the electric conductivity ac of the side wall is $1.25 \times 10^5$ (S/m), and the relative permeability μc thereof is 1.0. The calculation also has supposed that the electric conductivity σs of the SiC solution is $1 \times 10^6$ (S/m) and the relative permeability μs thereof is 1.0.

Referring to FIG. 3, as the frequency f increases up to 10 kHz, both the permeation depths D1 and D2 sharply decline. When the frequency f is more than 10 kHz, the permeation depths D1 and D2 decline as the frequency f increases. However, compared with when the frequency is less than 10 kHz, the degrees of decline of the permeation depths D1 and D2 with respect to an increase of the frequency f become smaller. In short, when the frequency f is more than 10 kHz, the permeation depths D1 and D2 do not decline so much even when the frequency f increases. From what described so far, as the frequency f increases, the permeation depths D1 and D2 defined by Formulas (2) and (3) decreases.

Figure 4A:
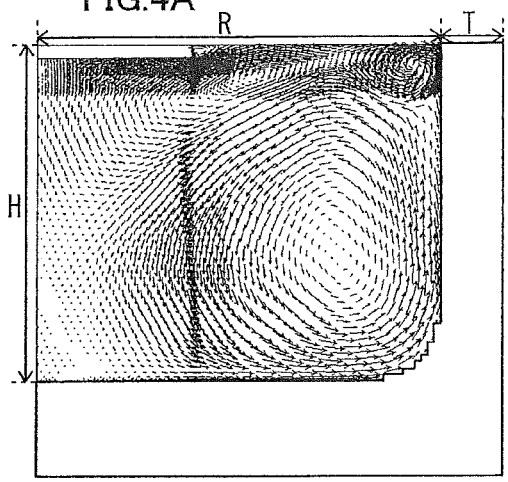
FIG. 4A is a distribution diagram of flow velocity vectors in the SiC solution when the frequency f is 3 kHz.

FIGS. 4A to 6B are diagrams each showing a flow pattern of the SiC solution 8 when the frequency f is changed. FIGS. 4A, 5A and 6A respectively show a result of thermohydraulic analysis in the crucible 6 obtained by a numerical analysis simulation. These figures were obtained by the following method. Supposing an axially symmetric RZ system, the calculation of electromagnetic field analysis was performed by a finite element method, and the calculation of thermohydraulic analysis was performed by a differential method. A manufacturing apparatus having the same configuration as that of FIG. 1 was set in the calculation model. The inner diameter (2R) of the crucible 6 was 130 mm, and the thickness T of the side wall 61 was 10 mm. The height H (see FIG. 4A) of the SiC solution 8 was 50 mm, and the outer diameters of the SiC seed crystal 9 and the seed shaft 41 were 50 mm. The ½ height portion of the induction heating unit 3 was set at the same height as that of the bottom surface of the crucible 6. The crucible 6 was a graphite crucible made of carbon. Under the aforementioned conditions, a thermohydraulic analysis in the SiC solution 8 was conducted when the frequency f of alternating current was set to 3, 5, and 10 kHz.

Figure 4B:
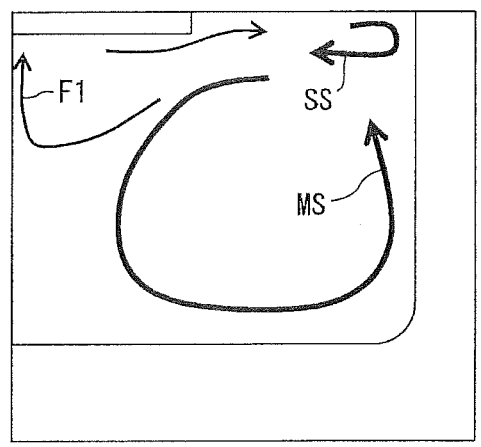
FIG. 4B is a schematic diagram of a flow pattern in the SiC solution of FIG. 4A.
Figure 5A:
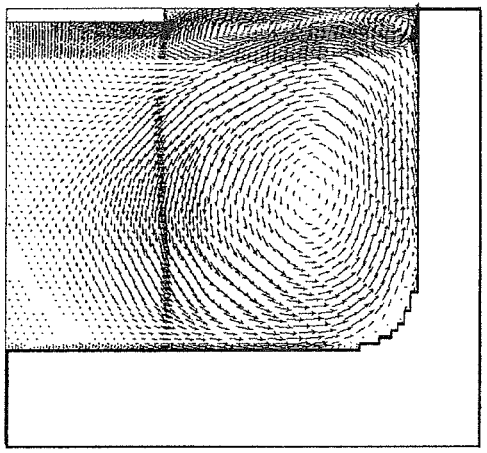
FIG. 5A is a distribution diagram of flow velocity vectors in the SiC solution when the frequency f is 5 kHz.
Figure 5B:
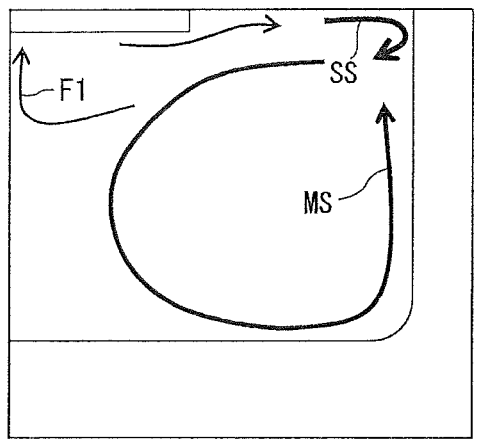
FIG. 5B is a schematic diagram of a flow pattern in the SiC solution of FIG. 5A.
Figure 6A:
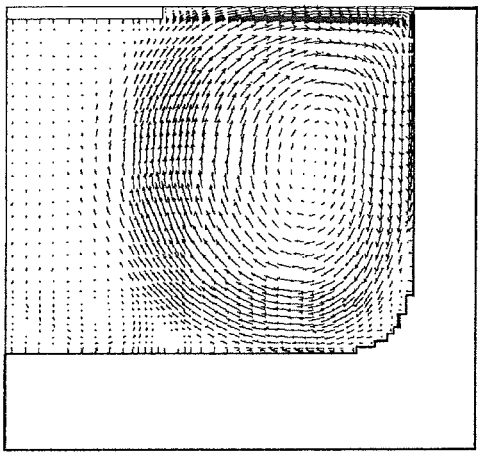
FIG. 6A is a distribution diagram of flow velocity vectors in the SiC solution when the frequency f is 10 kHz.
Figure 6B:
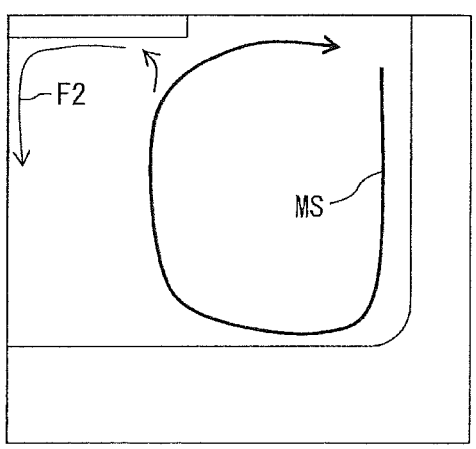
FIG. 6B is a schematic diagram of a flow pattern in the SiC solution of FIG. 6A.

FIG. 4A shows a distribution of flow velocity vectors in the SiC solution 8 when the frequency f is 3 kHz. FIG. 4B is a schematic diagram of a flow pattern in the SiC solution 8 of FIG. 4A. FIG. 5A is a distribution of flow velocity vectors in the SiC solution 8 when the frequency f is 5 kHz, and FIG. 5B is a, schematic diagram of the flow pattern in that case. FIG. 6A is a distribution of flow velocity vectors in the SiC solution 8 when the frequency f is 10 kHz, and FIG. 6B is a schematic diagram of the flow pattern in that case. FIGS. 4A to 6B are each a cross-sectional view of the right half of the crucible 6 with respect to the central axis thereof. Moreover, directions of the arrow heads in FIGS. 4A, 5A and 6A each indicate the direction in which the SiC solution 8 flows, and the length of each arrow head indicates the magnitude of flow velocity.

Referring to FIGS. 4A to 6B, a swirl (hereafter, referred to as a main swirl MS) occurred near the side wall 61 in each of the cases where the frequency f was 3, 5, and 10 kHz. The lower the frequency was, the larger the flow velocity of the main swirl MS was. That is, the flow velocity of the main swirl MS was maximum at the frequency f=3 kHz, and minimum at the frequency f=10 kHz. When the frequency is 3 kHz (FIGS. 4A and 4B), the main swirl MS goes up near the side wall 61 and goes down near the SiC seed crystal 9. When the frequency f=3 kHz, further, a swirl smaller than the main swirl MS (hereafter, referred to as a sub swirl SS) occurs. The sub swirl SS, which has a flow opposite to that of the main swirl MS, goes down near the side wall 61 and goes up inside the crucible 6. The flows of the main swirl MS and the sub swirl SS cause an upward flow F1 to occur below the SiC seed crystal 9.

Referring to FIGS. 5A and 5B, when the frequency f is 5 kHz as well, the main swirl MS goes up near the side wall 61 and goes down near the SiC seed crystal 9, as in the case where the frequency f=3 kHz. Further, a sub swirl SS also occurs. On that account, the flows of the main swirl MS and the sub swirl SS cause an upward flow F1 to occur below the SiC seed crystal 9. However, as described above, the flow velocity of the main swirl MS is smaller than that when the frequency f=3 kHz, and the flow velocity of the sub swirl SS is also small. Therefore, the flow velocity of the upward flow F1 is smaller than that when the frequency f=3 kHz.

Referring to FIGS. 6A and 6B, when the frequency f is 10 kHz, the flow of the main swirl MS becomes opposite to the flow of the main swirl MS when the frequency f is 3 kHz and 5 kHz. That is, the fluid goes down on the side of the side wall 61, of the main swirl MS, and goes up on the side of the center of the SiC solution 8. The flow velocity of the main swirl MS is small, and the size of the main swirl MS is also small. Further, the sub swirl SS does not occur. Since the flow velocity of the main swirl MS is weak, the upward flow portion (a fluid on the side of the center of the SiC solution 8) of the main swirl MS does not expand to near the central axis of the SiC solution 8. On that account, although the upward flow portion collides with the end portion of the seed crystal 9, a downward flow F2 in which fluid goes down is produced below a central portion of the SiC seed crystal 9.

From the aforementioned simulation results, the lower the frequency f is, the more likely the upward flow F1 occurs below the SiC seed crystal 9, and the flow velocity of the upward flow F1 increases. That is, it is more likely that a sub swirl SS is produced along with a main swirl MS, and an upward flow F1 is produced, when the permeation depths D1 and D2 are increased so that the Lorentz force permeates into the inside of the SiC solution 8.

Figure 7A:
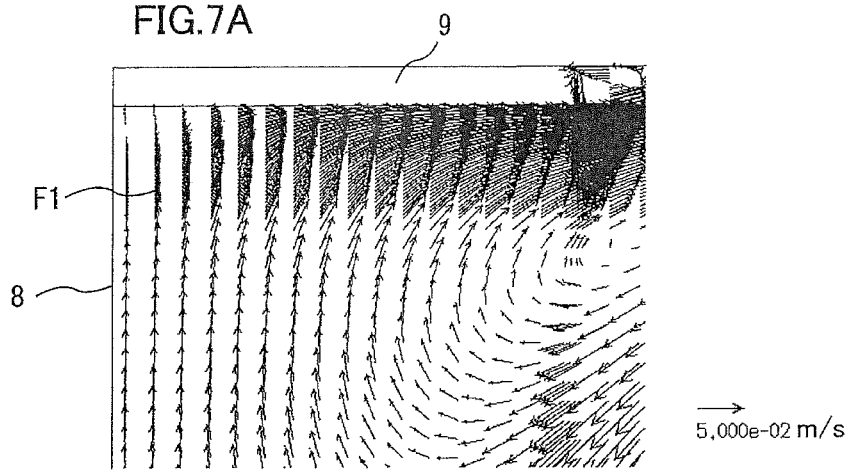
FIG. 7A is a distribution diagram of flow velocity vectors in the SiC solution when the side wall thickness of the crucible is 5 mm.
Figure 7B:
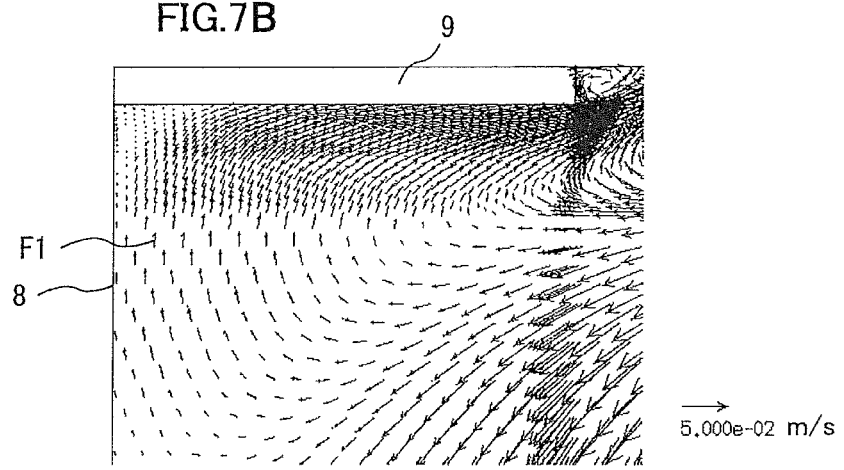
FIG. 7B is a distribution diagram of flow velocity vectors in the SiC solution when the side wall thickness of the crucible is 10 mm.
Figure 7C:
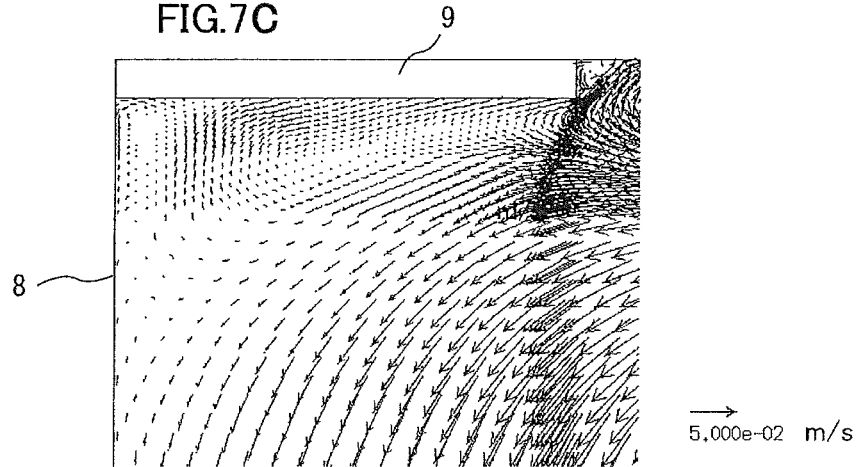
FIG. 7C is a distribution diagram of flow velocity vectors in the SiC solution when the side wall thickness of the crucible is 15 mm.

The Lorentz force is further influenced by the thickness T of the side wall 61. FIGS. 7A to 7C are each a distribution diagram of flow vectors in the SiC solution 8 when the frequency is kept constant and the thickness of the side wall 61 is varied. These figures have been obtained by the following method. A manufacturing apparatus having the same configuration as in FIG. 1 was set in the calculation model. The inner diameter 2R of the crucible 6 was 130 mm, the height H of the SiC solution 8 was 50 mm, and the outer diameters of the SiC seed crystal 9 and the seed shaft 41 were 50 mm. The ½ height portion of the induction heating unit 3 was set at the same height as that of the bottom surface of the crucible 6. The crucible 6 was a graphite crucible made of carbon. The frequency f of alternating current was kept constant at 5 kHz.

Under the aforementioned conditions, a flow velocity vector distribution in the SiC solution 8 was analyzed when the thickness T of the side wall 61 of the crucible 6 was set to 5 mm, 10 mm, and 15 mm. FIG. 7A is a distribution diagram of flow velocity vectors in the crucible 6 when the thickness T=5 mm. FIG. 7B is a distribution diagram of flow velocity vectors in the crucible 6 when the thickness T=10 mm. FIG. 7C is a distribution diagram of flow velocity vectors in the crucible 6 when the thickness T=15 mm. FIGS. 7A to 7C each show a portion near the SiC seed crystal 9, of a longitudinal section of the right half of the SiC solution 8. The directions of the arrow heads in FIGS. 7A to 7C each indicate the direction in which the SiC solution 8 flows, and the length of each arrow head indicates the flow velocity.

Referring to FIGS. 7A to 7C, when the thickness T=5 mm and 10 mm (FIGS. 7A and 7B), an upward flow F1 was formed. But, when the thickness T=15 mm (FIG. 7C), no upward flow F1 was formed. Further, the flow velocity of the upward flow F1 was larger when the thickness T=5 mm (FIG. 7A) than when the thickness T=10 mm (FIG. 7B).

From the aforementioned simulation results, it can be seen that as the thickness T decreases, the flow velocity of the upward flow F1 below the SiC seed crystal 9 increases. This is because, as the thickness T increases, it becomes more difficult for the Lorentz force to permeate into the SiC solution 8.

The Lorentz force is further influenced by the inner radius R of the crucible 6. To be specific, the permeation depth into the solution is as shallow as about 5 mm as shown in FIG. 3. Therefore, the Lorentz force concentrates near the outer layer of the solution. Therefore, as the inner radius R of the crucible 6 increases, it becomes more difficult for the flow by the Lorentz force to propagate to the central part of the SiC solution 8. On that account, as the inner radius R increases, the flow velocity of the upward flow F1 decreases, or the upward flow F1 becomes not likely to occur.

From what described so far, as the Lorentz force acting on the SiC solution 8 increases, an upward flow F1 having a larger flow velocity is likely to be produced. Further, the Lorentz force acting on the SiC solution 8 is influenced by the frequency f, the thickness T of the side wall 61, and the inner radius R of the crucible 6. To be specific, the Lorentz force acting on the SiC solution 8 increases, as the frequency f decreases, the thickness T decreases, and the inner radius R decreases. On that account, it becomes more likely that a main swirl MS and a sub swirl SS having a large flow velocity are produced in the SiC solution 8, and thus an upward flow F1 having a large flow velocity is produced.

Further, when the control unit 7 sets the frequency f such that it satisfies Formula (1), an upward flow F1 is produced in the SiC solution 8 and the flow velocity significantly increases.

Figure 8:
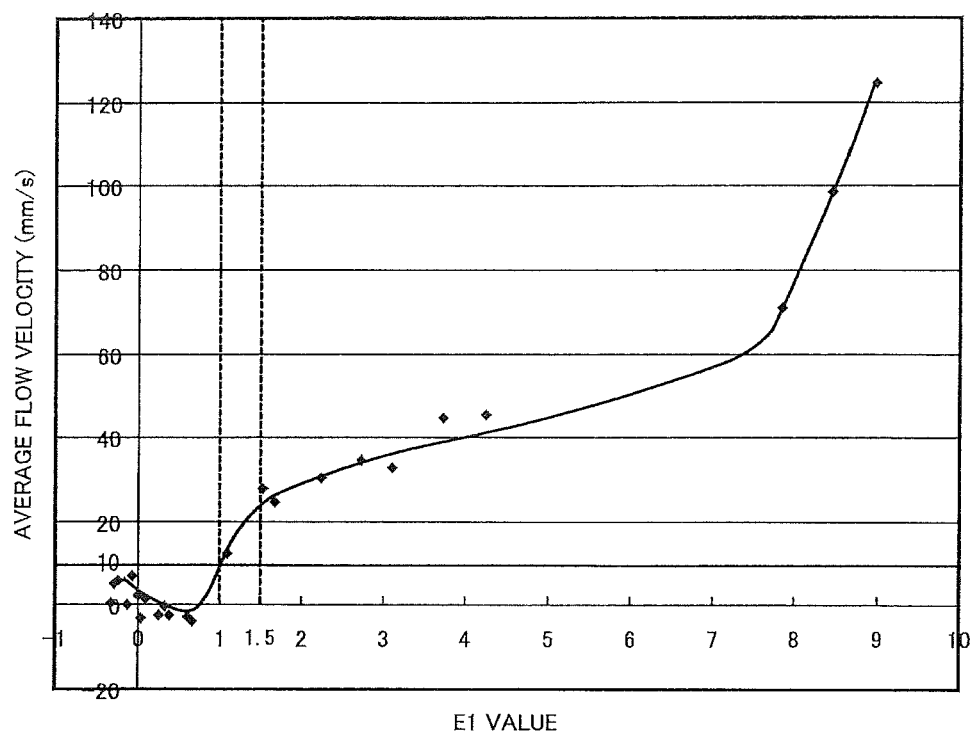
FIG. 8 is a diagram showing the relationship between the value of the left hand side, $E1=(D1-T) \times D2/R$, of Formula (1) and the average flow velocity of upward flow.

FIG. 8 is a diagram showing the relationship between the value of the left hand side, $E1=(D1-T)\times D2/R$, of Formula (1) and the average flow velocity of the upward flow F1. FIG. 8 was obtained by the following method. Supposing an axially symmetric RZ system, the calculation of electromagnetic field analysis was performed by a finite element method, and the calculation of thermohydraulic analysis was performed by a differential method. A manufacturing apparatus having the same configuration as that of FIG. 1 was set in the calculation model. The inner diameter 2R of the crucible 6 was set to 130 mm, and the thickness T of the side wall 61 to 10 mm. The height H of the SiC solution 8 was 50 mm, and the outer diameters of the SiC seed crystal 9 and the seed shaft were 50 mm. The ½ height portion of the induction heating unit 3 was set at the same height as that of the bottom surface of the crucible 6. The crucible 6 was a graphite crucible made of carbon.

For each simulation, the frequency f, the thickness T, and the inner radius R were varied. Then, the E1 value was determined for each condition. Further, for each simulation, an average flow velocity (mm/s) of a range from the center of the SiC seed crystal 9 to an end of the SiC seed crystal 9 (i.e., of a width of 25 mm and hereafter, this range being referred to as the "calculation area") was calculated at a position 5 mm below from the lower end of the SiC seed crystal 9, in the SiC solution 8. When an average flow velocity is plus (+), it indicates that the fluid (SiC solution 8) of the calculation area is going up at the calculated average flow velocity. When an average flow velocity is minus (−), it indicates that the fluid of the calculation area is going down at the calculated average flow velocity. FIG. 8 was created based on the E1 values and average flow velocities which had been obtained.

In the manufacturing of a SiC single crystal by the solution growth method, a preferred average flow velocity is not less than 10 mm/s. Referring to FIG. 8, when the E1 value was less than 1, the average flow velocity was less than 10 mm/s and, as the E1 value increased, the average flow velocity gradually decreased into minus. On the other hand, when the E1 value was more than 1, that is, satisfied Formula (1), the average flow velocity substantially increased and exceeded 10 mm/s. Further, as the E1 value increased, the average flow velocity substantially increased, and when the E1 value became not less than 1.5, the average flow velocity exceeded 20 mm/s. Further, when the E1 value became not less than 7.5, the average flow velocity substantially increased and exceeded 60 mm/s.

From what described so far, the control unit 7 performs adjustment that an alternating current of a frequency f that satisfies Formula (1) is passed to the induction heating unit 3. This will make it possible to produce an upward flow F1 having a large flow velocity below the SiC seed crystal 9. Preferably, the E1 value is not less than 1.5. In this case, the average flow velocity of the fluid of the calculation area exceeds 20 mm/s.

[Manufacturing Method of SiC Single Crystal]

A method for manufacturing a SiC single crystal by using the manufacturing apparatus 100 having the above described configuration will be described. In the method for manufacturing a SiC single crystal, first, the manufacturing apparatus 100 is provided and a SiC seed crystal 9 is attached to the seed shaft 41 (providing step). Next, the crucible 6 is disposed in the chamber 1 to produce the SiC solution (SiC solution production step). Next, the SiC seed crystal 9 is brought into contact with the SiC solution in the crucible 6 (immersion step). Next, the SiC single crystal is grown (growth step). In the growth step, by passing an alternating current of a frequency f to the induction heating unit 3 by the control unit 7, an upward flow F1 having a large flow velocity is produced below the seed crystal 9 in the SiC solution 8. This will lead to an increase in the degree of supersaturation of carbon near the seed crystal 9, thereby accelerating the growth of the SiC single crystal. Hereafter, details of each step will be described.

[Providing Step]

First, the manufacturing apparatus 100 including the seed shaft 41 is provided. Then, the SiC seed crystal 9 is attached to the lower end surface 410 of the seed shaft 41.

[SiC Solution Production Step]

Next, the crucible 6 is disposed on the rotating member 51 in the chamber 1. The crucible 6 houses the starting material of SiC solution. The crucible 6 is preferably disposed in coaxial with the rotating member 51. In this case, when the rotating member 51 rotates, the temperature of the SiC solution in the crucible 6 is likely to be kept uniform.

Next, the SiC solution 8 is produced. Inert gas is filled in the chamber 1. The inert gas is, for example, helium and argon. Next, the control unit 7 controls the induction heating unit 3 so as to inductively heat the starting material of the SiC solution 8 in the crucible 6 to not less than the melting point. When carbon is contained in the inner surface of the side wall 61 of the crucible 6, heating the crucible 6 will cause carbon to dissolve into the melt from crucible 6, thereby producing a SiC solution 8. When the crucible 6 does not contain carbon, carbon is contained in the starting material of the SiC solution 8. The SiC solution 8 contains Si and C, and further may contain other metal elements.

[Contacting Step]

Next, the SiC seed crystal 9 is brought into contact with the SiC solution 8. To be specific, the seed shaft 41 is moved down by the driving source 42 to bring the SiC seed crystal 9 into contact with the SiC solution 8.

[Growth Step]

After bringing the SiC seed crystal 9 into contact with the SiC solution 8, the control unit 7 controls the induction heating unit 3 to hold the SiC solution 8 at the crystal growth temperature. Further, the control unit 7 controls the induction heating unit 3 to stir the SiC solution 8, thereby forming the upward flow F1 below the SiC seed crystal 9.

In short, the control unit 7 heats the SiC solution 8 to the crystal growth temperature, and stirs the SiC solution 8 to produce the upward flow F1. To be specific, the control unit 7 makes adjustment so that the frequency f of the alternating current to be passed to the induction heating unit 3 satisfies Formula (1). This will allow the control unit 7 to heat and stir the SiC solution 8, thereby producing an upward flow F1 having a large flow velocity.

The control unit 7 further controls the induction heating unit 3 such that the SiC seed-crystal peripheral area of the SiC solution 8 is supercooled, thereby being supersaturated with SiC. The method for cooling the SiC seed-crystal peripheral area is as follows. For example, the control unit 7 controls the induction heating unit 3 so as to keep the temperature of the peripheral area of the SiC seed-crystal 9 to be lower than that of the other portion of the SiC solution 8. Moreover, the peripheral area of the SiC seed-crystal 9 may be cooled with a coolant. To be specific, a coolant is circulated inside the seed shaft 41. The coolant may be, for example, water. Circulating the coolant in the seed shaft 41 will cause the SiC seed crystal 9 to be cooled. When the SiC seed crystal 9 is cooled, a portion near the SiC seed crystal 9 will also be cooled. When the peripheral area of the SiC seed-crystal 9 is brought into a supercooled state by the above described method, the SiC concentration increases and becomes supersaturated.

Subsequently, the SiC seed crystal 9 and the Sic solution 8 are rotated while SiC in the peripheral area of the SiC seed-crystal 9 of the Sic solution 8 being kept supersaturated. Rotating the seed shaft 41 will cause the SiC seed crystal 9 to rotate. Rotating the rotating member 51 will cause the crucible 6 to rotate. The rotational direction of the SiC seed crystal 9 may be opposite to, or the same as that of the crucible 6. Moreover, the rotational speed may be constant or variable. The seed shaft 41 gradually moves up while rotating. In this occasion, a SiC single crystal is produced and grown on the surface of the SiC seed crystal 9 which is in contact with the SiC solution 8. At this moment, the control unit 7 passes an alternating current of a frequency f that satisfies Formula (1) to the induction heating unit 3. On account of that, an upward flow F1 is formed below the SiC seed crystal 9 in the SiC solution 8 by the Lorentz force produced by the induction heating unit 3. Thus, carbon is frequently fed to the vicinity of the SiC seed crystal 9 so that the degree of supersaturation of carbon in a portion near the SiC seed crystal 9 is maintained to be high.

From what described so far, in the method for manufacturing a SiC according to the present invention, the control unit 7 sets a frequency f that satisfies Formula (1) and controls the induction heating unit 3. On that account, it is possible to maintain the degree of supersaturation of carbon in a portion near the seed crystal 9 at a high level, thereby accelerating the growth rate of the SiC single crystal.

The inner surface of the side wall 61 of the crucible 6 preferably contains carbon. In this case, carbon dissolves into the SiC solution from the side wall 61 and is conveyed to below the SiC seed crystal 9 by the upward flow F1. On that account, the degree of supersaturation of carbon of a portion near the SiC seed crystal 9 is likely to increase. More preferably, the crucible 6 is made of graphite.

In the above describe embodiment, the manufacturing apparatus 100 includes the insulating member 2. However, the manufacturing apparatus 100 may not include the insulating member 2.

Example 1

In the above described method for manufacturing a SiC single crystal, simulations were carried out by varying the frequency f, the thickness T and the inner radius R, and analyzed the flow pattern in the SiC solution. Then, the flow velocity of the SiC solution below the SiC seed crystal was determined.

[Simulation Method]

The simulation was conducted as described below. Supposing an axially symmetric RZ system, the calculation of electromagnetic field analysis was performed by a finite element method, and the calculation of thermohydraulic analysis was performed by a differential method. A manufacturing apparatus 100 having the same configuration as that of FIG. 1 was set in the calculation model. The inner diameter 2R of the crucible 6 was set to 130 mm, and the thickness T of the side wall 61 to 10 mm. The height H of the SiC solution 8 was 50 mm, and the outer diameters of the SiC seed crystal 9 and the seed shaft were 50 mm. The ½ height portion of the induction heating unit 3 was set at the same height as that of the bottom surface of the crucible 6. The crucible 6 was a graphite crucible made of carbon.

For each simulation, the frequency f, the thickness T, and the inner radius R were varied. Then, Formula (1) was determined for each condition. The values at each condition are shown in Table 1.

TABLE 1

| | Thickness T and inner radius R | | | | |
|---|---|---|---|---|---|
| Frequency | T = 5 mm R = 70 mm | T = 10 mm R = 65 mm | T = 15 mm R = 60 mm | T = 20 mm R = 55 mm | T = 25 mm R = 50 mm |
| 1 kHz | 8.971 | 8.454 | 7.85 | 7.136 | 6.28 |
| 2 kHz | 4.25 | 3.723 | 3.108 | 2.381 | 1.51 |
| 3 kHz | 2.718 | 2.23 | 1.661 | 0.988 | 0.181 |
| 5 kHz | 1.514 | 1.091 | 0.597 | 0.013 | −0.688 |
| 10 kHz | 0.656 | 0.324 | −0.063 | −0.52 | −1.07 |
| 15 kHz | 0.383 | 0.101 | −0.228 | −0.617 | −1.084 |
| 20 kHz | 0.254 | 0.004 | −0.288 | −0.634 | −1.048 |
| 50 kHz | 0.043 | −0.124 | −0.319 | −0.55 | −0.827 |

Each field in Table 1 shows an E1 value. Referring to Table 1, simulations were carried out at 40 conditions in which the frequency f, the thickness T and the inner radius R were different.

The electromagnetic field analysis and thermohydraulic analysis were carried out for each condition to obtain flow analysis results as shown in FIGS. 6A, 7A, and 8A. Based on these results, an average flow velocity (mm/s) of a range from the center of the SiC seed crystal to an end of the seed crystal (i.e., of a width of 25 mm) was calculated at a position 5 mm below from the lower end of the SiC seed crystal. The calculated results of average flow velocity are shown in Table 2.

TABLE 2

| | Thickness T and inner radius R | | | | |
|---|---|---|---|---|---|
| Frequency | T = 5 mm R = 70 mm | T = 10 mm R = 65 mm | T = 15 mm R = 60 mm | T = 20 mm R = 55 mm | T = 25 mm R = 50 mm |
| 1 kHz | 124.6 | 98.5 | 71.1 | 31.1 | 24.7 |
| 2 kHz | 45.5 | 44.6 | 32.7 | 19.2 | 15.5 |
| 3 kHz | 34.8 | 30.2 | 24.7 | 7 | 9.9 |
| 5 kHz | 27.9 | 12.3 | −2.7 | −2.6 | 6.5 |
| 10 kHz | −3.8 | −0.05 | 6.8 | 9.8 | 5.5 |
| 15 kHz | −2.3 | 1.4 | 5.8 | 4.3 | 4.1 |
| 20 kHz | −2.5 | 2.3 | 5.3 | 3.6 | 3 |
| 50 kHz | −3 | 0.25 | 0.49 | 0.73 | 0.43 |

The value in each field in Table 2 represents an average flow velocity (mm/s). Referring to Tables 1 and 2, the average flow velocity when each condition satisfied Formula (1) was substantially higher compared with that when the each condition did not satisfy Formula (1).

Although embodiments of the present invention have been described so far, the above described embodiments are merely exemplification for carrying out the present invention. Therefore, the present invention will not be limited to the embodiments described above, and the above described embodiments can be appropriately modified and carried out within a range not departing from the spirit of the present invention.

The invention claimed is:

1. A method for manufacturing a SiC single crystal, comprising steps of:
    providing a manufacturing apparatus comprising: a crucible including a tubular side wall made up of graphite and having a side wall thickness of 5 mm to 25 mm, and a bottom wall disposed at a lower end of the tubular side wall, the crucible housing a SiC solution; a chamber housing the crucible; a vertical seed shaft, a SiC seed crystal attached to a lower end surface of the seed shaft; and an induction heating unit disposed around the tubular side wall of the crucible in the chamber;
    bringing the SiC seed crystal attached to the seed shaft into contact with the SiC solution in the crucible;
    controlling the induction heating unit such that a frequency f (Hz) of alternating current to be passed to the induction heating unit satisfies Formula (1), where D1 (mm) indicates a permeation depth of electromagnetic waves into the tubular side wall by the induction heating unit, D2 (mm) indicates a permeation depth of electromagnetic waves into the SiC solution by the induction heating unit, T (mm) indicates the thickness of the tubular side wall, and R (mm) indicates an inner radius of the crucible; and
    growing the SiC single crystal on the SiC seed crystal while rotating the seed shaft:

$$(D1-T) \times D2/R > 1.5 \qquad (1)$$

where, D1 is defined by Formula (2), and D2 is defined by Formula (3):

$$D1 = 503292 \times (1/(f \times \sigma c \times \mu c))^{1/2} \qquad (2)$$

$$D2 = 503292 \times (1/(f \times \sigma s \times \mu s))^{1/2} \qquad (3)$$

where, $\sigma c$ is an electric conductivity (S/m) of the tubular side wall, and $\sigma s$ is an electric conductivity (S/m) of the SiC solution; $\mu c$ is a relative permeability (dimensionless quantity) of the tubular side wall, and $\mu s$ is a relative permeability (dimensionless quantity) of the SiC solution.

2. The method of claim 1, wherein the manufacturing apparatus providing step further comprises:
    providing a memory-containing central processing unit for controlling the induction heating unit, wherein the control unit controls the induction heating unit such that the frequency f (Hz) of alternating current to be passed to the induction heating unit satisfies the Formula (1), where the D1 (mm) indicates the permeation depth of electromagnetic waves into the side wall by the induction heating unit, the D2 (mm) indicates the permeation depth of electromagnetic waves into the SiC solution by the induction heating unit, the T (mm) indicates the thickness of the side wall, and the R (mm) indicates the inner radius of the crucible:

$$(D1-T) \times D2/R > 1.5 \qquad (1)$$

where, the D1 is defined by the Formula (2), and the D2 is defined by the Formula (3):

$$D1 = 503292 \times (1/(f \times \sigma c \times \mu c))^{1/2} \qquad (2)$$

$$D2 = 503292 \times (1/(f \times \sigma s \times \mu s))^{1/2} \qquad (3)$$

where, the σc is the electric conductivity (S/m) of the tubular side wall, the σs is the electric conductivity (S/m) of the SIC solution, the μc is the relative permeability (dimensionless quantity) of the tubular side wall, and the μs is the relative permeability (dimensionless quantity) of the SIC solution.

3. The method of claim 1, wherein the frequency f (Hz) of alternating current to be passed to the induction heating unit is not less than 1 kHz.

4. A manufacturing apparatus of a SiC single crystal, comprising:

a crucible including a tubular side wall made up of graphite and having a side wall thickness of 5 mm to 25 mm, and a bottom wall disposed at a lower end of the side wall, the crucible being able to house a SiC solution;

a chamber housing the crucible;

a vertical seed shaft having a lower end surface to which a SiC seed crystal is to be attached, the seed shaft being able to bring the SiC seed crystal attached to the lower end surface into contact with the SiC solution;

an induction heating unit disposed around the side wall of the crucible in the chamber; and a control unit comprising a central processing unit, memories, and a control program for controlling the induction heating unit, wherein the control unit controls the induction heating unit such that a frequency f (Hz) of alternating current to be passed to the induction heating unit satisfies Formula (1), where D1 (mm) indicates a permeation depth of electromagnetic waves into the side wall by the induction heating unit, D2 (mm) indicates a permeation depth of electromagnetic waves into the SiC solution by the induction heating unit, T (mm) indicates the thickness of the side wall, and R (mm) indicates an inner radius of the crucible:

$$(D1-T) \times D2/R > 1.5 \qquad (1)$$

where, D1 is defined by Formula (2), and D2 is defined by Formula (3):

$$D1 = 503292 \times (1/(f \times \sigma c \times \mu c))^{1/2} \qquad (2)$$

$$D2 = 503292 \times (1/(f \times \sigma s \times \mu s))^{1/2} \qquad (3)$$

where, σc is an electric conductivity (S/m) of the side wall, σs is an electric conductivity (S/m) of the SiC solution, μc is a relative permeability (dimensionless quantity) of the side wall, and μs is a relative permeability (dimensionless quantity) of the SiC solution.

* * * * *